United States Patent [19]

Dominguez et al.

[11] 4,331,492
[45] May 25, 1982

[54] METHOD OF MAKING A SOLAR PANEL

[75] Inventors: Ramon Dominguez, Rockville; Jack R. Anderson, Gaithersburg, both of Md.

[73] Assignee: Solarex Corporation, Rockville, Md.

[21] Appl. No.: 85,593

[22] Filed: Oct. 17, 1979

[51] Int. Cl.³ .............................................. H01L 31/18
[52] U.S. Cl. ...................... 156/66; 136/251; 156/91; 156/286; 156/297; 156/300; 156/307.3; 156/307.7
[58] Field of Search ............... 136/89 EP, 89 P, 251, 136/244; 29/572; 156/285, 66, 286, 91, 307.3, 307.7, 300, 297

[56] References Cited

U.S. PATENT DOCUMENTS

| 3,116,171 | 12/1963 | Nielsen et al. | 136/89 |
| 3,330,700 | 7/1967 | Golub et al. | 136/89 |
| 3,446,676 | 5/1969 | Webb | 136/89 |
| 3,565,719 | 2/1971 | Webb | 156/212 |
| 4,057,439 | 11/1977 | Lindmayer | 136/89 P |
| 4,203,646 | 5/1980 | Desso et al. | 339/205 |

FOREIGN PATENT DOCUMENTS 1439203  4/1966  France .................. 136/89

*Primary Examiner*—Aaron Weisstuch
*Attorney, Agent, or Firm*—Watson, Cole, Grindle & Watson

[57] ABSTRACT

A solar panel in which interconnected photovoltaic cells are maintained in light-receiving position by electrically conductive clips secured to the base of the panel. When the cells and clips are encapsulated in a protective resin, a vacuum is drawn during encapsulation to remove air bubbles trapped beneath the cells.

2 Claims, 4 Drawing Figures

U.S. Patent  May 25, 1982  4,331,492
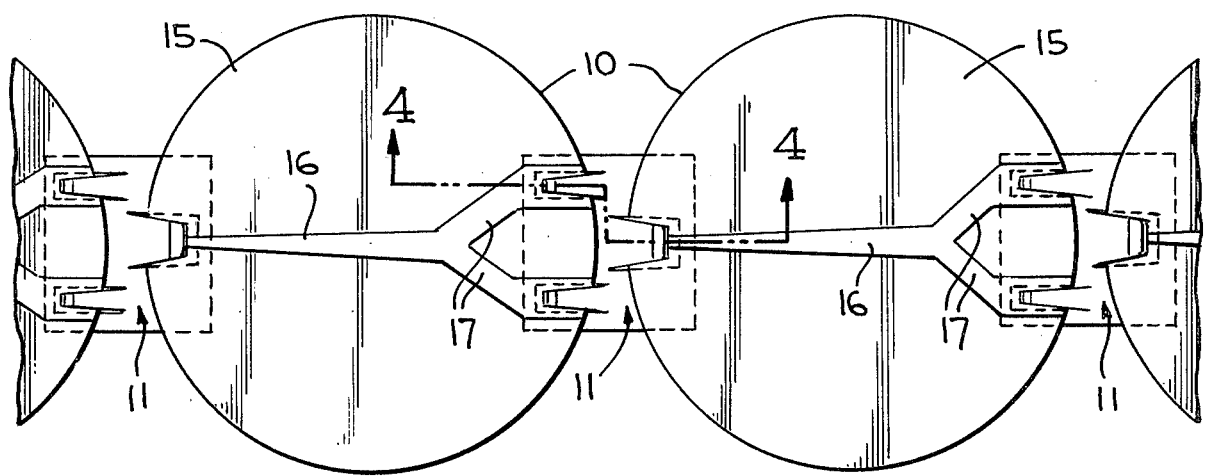
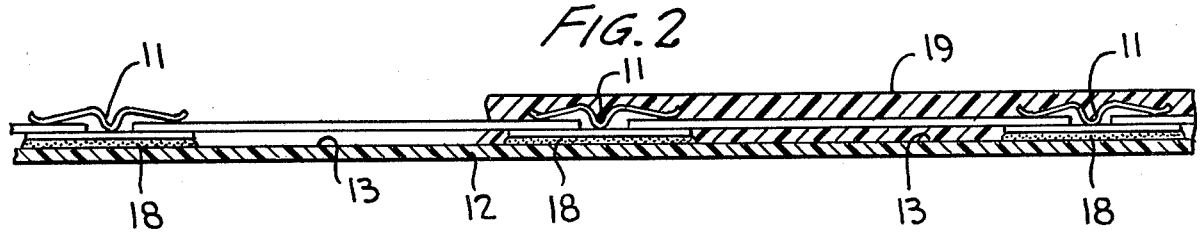
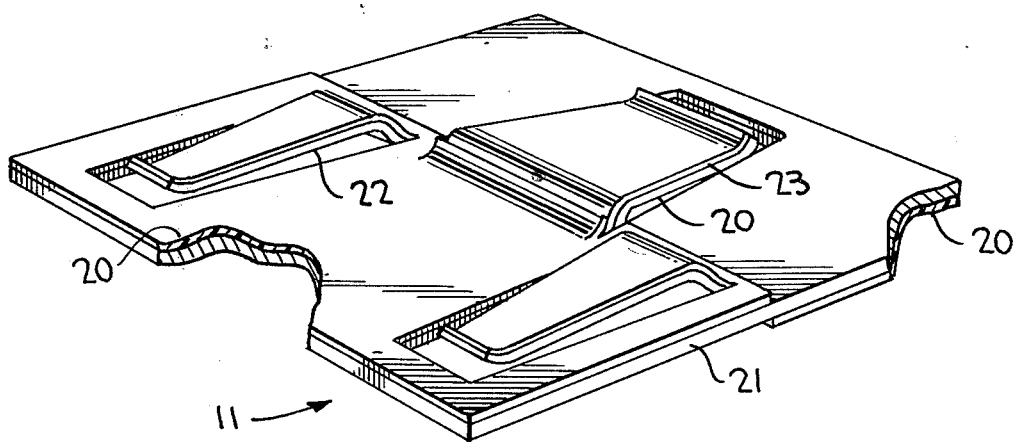
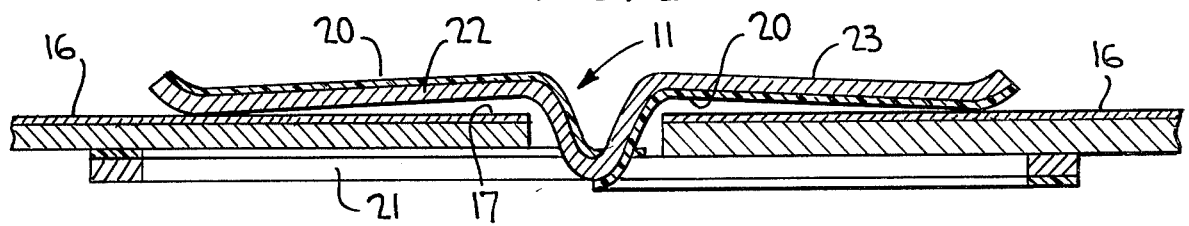

METHOD OF MAKING A SOLAR PANEL

BACKGROUND OF THE INVENTION

The present invention relates generally to the field of photovoltaic cells, also commonly known as solar cells. More particularly, it relates to structures referred to as solar panels, by means of which a plurality of solar cells are maintained in substantially fixed relationship with respect to each other and are protected from ambient conditions while being exposed in light-receiving position.

As a general procedure, solar panels are usually manufactured first by soldering or otherwise joining individual solar cells to form a strip of cells that are connected to each other in series or in parallel. The strip of cells is adhered within a tray having an open face, generally by an adhesive material so that, after curing of the adhesive, the cells are maintained in fixed position within the tray. Adhesive material is often used an an encapsulant for the cells, i.e., it completely surrounds the cells and serves not only to keep the strip of cells in position to receive light so that the cells do not shift when subjected to external jarring or even when the panel is moved from one location to another, but also protects the cells from rain, snow and other ambient conditions that will detract from the performance of the cells. When a strip of cells in a panel is to be encapsulated, the encapsulant selected is one that is transparent and has desirable light-transmitting properties; it provides minimal obstruction to the passage of light of those wavelengths for the reception of which the cells have been designed. Also, the encapsulant will have optimal weathering characteristics, even if a further protective cover, e.g., a sheet of glass, is provided to cover the open face of the tray.

Solar panels should have as high a life expectancy as possible. As stated in commonly assigned U.S. Pat. No. 4,057,439 to Dr. Joseph Lindmayer, the disclosure of which is incorporated by reference herein for use where requisite, the life of solar panels should be ten, preferably twenty years. While properly protected photovoltaic cells, having no moving parts, have an indefinite life span, solar panels that house the cells present a greater problem in terms of life expectancy. When delamination occurs, or one of the basic components of the panel fails, the entire panel can become inoperative although all, or almost all of the solar cells within the panel are in operative condition. The Lindmayer patent is directed to a solar panel in which a silicone resin is utilized as an encapsulant.

While the Lindmayer patent was directed primarily to overcoming the problem of delamination of the cured encapsulant layer from the panel, as would be expected, there are still many other problems extant in the manufacture and use of solar panels, both from ambient conditions and in economies of panel making. Thus, one problem that is extant is achieving perfect alignment of cells where more than one strip of cells is housed within a single solar panel. Since the cells of the strip or string are all joined one to the other by soldering, the longer the string the more the possiblility of deviation from a flat, aligned strip, as the strip will tend to float in its encapsulant before the encapsulant has been cured from a liquid to a solid state. Also, air bubbles can become trapped beneath cells in the liquid encapsulant, leading to oxidation and deterioration of photovoltaic characteristics in the cells. Finally the need to solder adjoining solar cells together represents an added expense, for the portions of the cells to be joined must be coated with a relatively expensive, solderable material before such soldering can take place.

SUMMARY OF THE INVENTION

The present invention is directed toward meeting the foregoing problems. By its structure and the method of encapsulation employed, we have eliminated the need for soldering cells together to form a string. Thus, there is no requirement for providing a solderable metal on either surface of the cells. By the structure of our invention, cells are held securely in alignment, both laterally and longitudinally during encapsulation; they do not float in the encapsulant. By the method of our invention, the presence of trapped air bubbles beneath the cells during encapsulation is substantially diminished.

In its broad form, our invention comprises a solar panel formed from a tray including a base member and upstanding edge members. The base has an upwardly facing surface to which are attached, directly or indirectly, a plurality of clips spaced from each other a predetermined distance and solar cells are mounted in said clips and held thereby. Finally, a protective means overlies the cells and clips so that the cells are maintained within the tray in position to receive light impinging on them and convert that light into electrical energy while being protected from ambient conditions.

It is presently preferred that the clips be in the form of resilient sheets having spring arms formed therein to clasp the solar cells. The clips may be adhesively mounted on the upwardly facing surface of the base member. Indeed, the entirety of that surface may be coated with a silicone resin, which can be utilized as the adhesive. Then another layer of silicone resin or other encapsulant may surround the cells completely, and/or another protective means, such as a glass cover, can be used. The clips may also be formed integral with the base member.

With respect to the method form of the present invention, when an encapsulant for the cells is used, a vacuum may be drawn after the encapsulant has surrounded the cells in order to eliminate any trapped air bubbles in the encapsulant. The encapsulant is then cured and becomes a firm though somewhat resilient, cushioning mass.

These and other objects, features and advantages of this invention will become more apparent when taken in connection with illustration of a preferred embodiments thereof in the accompanying drawing, in which FIG. 1 is a top plan view of the preferred embodiment, showing photovoltaic cells joined by clips;

FIG. 2 is a vertical longitudinal sectional view along the longitudinal center line of FIG. 1;

FIG. 3 is an enlarged perspective view of the clip of FIGS. 1 and 2, partly broken away; and, FIG. 4 is an enlarged sectional view taken along the line 4—4 of FIG. 1.

DETAILED DESCRIPTION OF THE INVENTION

Referring now to the drawings, a strip of solar cells 10 is illustrated with the cells held together by clips, indicated generally by reference numeral 11. The drawing shown here should be taken in connection with that of U.S. Pat. No. 4,057,439 for the general structure of the tray, only the base member 12 of which is illustrated in the drawing of the present patent application. As in the tray shown in FIG. 1 of said U.S. Pat. No. 4,057,439, the preferred tray of the present invention is rectangular in shape and has upstanding members in the form of sides and ends, as well as a continuous base 12 having an upwardly facing, substantially planar surface 13 within the tray.

As shown generally in FIG. 1 the solar cells 10 are seen with their upper surfaces 15 exposed. On those upper surfaces are an elongated front contact 16 that terminates at one end in a pair of arms 17. For ease of illustration, the many narrow collecting fingers that feed the contacts 16 on the front, light-receiving surface of the cells have not been drawn.

Also not shown is the back surface of the cells, which usually is covered with a continuous metallic coating that forms the back contact or electrode, the front and back electrodes being of opposite charges. Thus, as illustrated in FIG. 2 of U.S. Pat. No. 4,057,439, when a plurality of cells are connected in series, the back contact of one cell is connected to the front contact or electrode of the next cell in the strip, which in turn has its back contact connected to the front contact of the next cell, etc.

According to the present invention, this sequence is accomplished by means of clips, the preferred attachments of which is shown in FIG. 2. It will there be seen that the base member 12 is a continuous sheet having a substantially planar, upwardly facing surface 13 that forms the bottom surface of the tray. Selected areas of surface 13 are covered with a layer of adhesive 18, and positioned and secured to such layers 18 are clips 11. The solar cells 10 are positioned beneath arms of the clips and held above the upward surface 13 of base member 12. As is also best illustrated in FIG. 2, after the clips have been secured by the adhesive layers 18, a layer of encapsulant 19 is poured over and around the cells 10 and clips 11 and, as shown on the right side of FIG. 2 completely envelops them. That encapsulant, of course, extends across the entire bottom of the tray and forms a pool across the tray.

While it does not form a separate, divisible part of our invention, the clip 11, is illustrative of clips that can be used as part of the solar panel claimed herein. As seen in FIG. 3, clip 11 is made from a unitary piece of formable metal. Since the metal is electrically conductive, only portions of the clip are to be conductive, parts of the clip are coated with non-conductive material. As will be apparent from the cut-away portion, the left side of the clip 11 of FIG. 3 has a non-conductive coating 20, which overlies the metal body 21 of the clip. From the cut-away portion of the right side it will be seen that on that side the insulating coating 20 is on the bottom of the clip. Clip 11 has two arms 22 on its upwardly insulated side and a single prong 23 on its upwardly conductive side. As will be seen in FIG. 4, however, the upward surfaces of arms 22 bear insulating coating 20, while that coating 20 is only on the lower surface of prong 23.

The result of this structure of clip 11 is that on one side the clip is in electrical contact with the front (i.e., top surface) contacts of the solar cell; the other side of the clip is in electrical contact with the back contact of the cell. In the embodiment illustrated electrical contact is made between the arms 17 of cell front contact 16 and the overlying arms 22 of clip 11. Since the lower surface of prong 23 is covered by insulating layer 20, no electrical contact is made there and instead the contact is between the bottom electrode of the solar cell and the metallic, electrically conductive body of the clip. Thus a series interconnection of solar cells has been effected.

With respect to the method and structure of this invention, a tray is first provided, the tray having a base member of the proper material, e.g., epoxy fiberglass or, as disclosed in our U.S. Pat. No. 4,116,207, one made from a polyester resin. The clips are adhered to the based member preferably by an adhesive, e.g., by a single component RTV silicone resin, which may be used to spot glue the clips or as a layer over the entirety of the upper surface of the base member. Where the protective means is comprised of an encapsulant, it may be a multi-component silicone resin, such as Sylgard 182, made by Dow Corning Corp. Where the protective means includes a glass cover, the glass should be such as will not substantially inhibit passage of light of wavelengths at which the solar cells are most efficient.

In the preferred manufacture of the solar panel, solar cells, either singly (as illustrated) or in pairs or greater numbers, are inserted between adjoining clips. Then the liquid encapsulant is poured into the tray and the tray subjected to a vacuum, e.g., to about 5 to 15 mm. of Hg to remove any air bubbles that may have been trapped beneath the cells. Then, if desired, a glass plate is positioned over the cells.

While the present invention has been described with reference to a preferred embodiment, it will be apparent that those of skill in this art will find obvious many alterations and modifications thereof. Thus, it is also possible for the clips to be attached to a superstrate, such as a glass or plastic cover for the panel. As to all such obvious alterations and modifications, it is desired that they be deemed to fall within the scope of the invention, which is to be limited only by the purview, including equivalents, of the following, appended claims.

I claim:

1. A method of forming a solar panel for maintaining a plurality of photovoltaic cells in interconnected relationship and in position to receive light impinging thereon and convert light energy into electrical energy, comprising, providing a tray within which said cells are to be retained, said tray including a base member, mounting electrically conductive clips on said base member in spaced relationship to enable adjacent clips to accommodate cells between them, inserting at least one cell between each pair of adjoining clips so that, through one of said clips, electrical contact is effected between the top surface or bottom surface electrode of one cell and the bottom surface or top surface electrode of the next adjacent cell held by said clip, overlying said cells and said clips with a liquid encapsulant having optical properties enabling quantities of light to pass therethrough, and curing the encapsulant to a firm state whereby said cells are maintained in light-receiving position while being cushioned and protected from ambient conditions by said encapsulant.

2. A method of forming a solar panel as claimed in claim 1, in which after or while said cells and said clips are overlaid with said liquid encapsulant, said tray is subjected to subatmospheric pressure to remove any trapped air bubbles.

* * * * *